(12) United States Patent
Case

(10) Patent No.: US 6,335,973 B1
(45) Date of Patent: *__Jan. 1, 2002__

(54) SYSTEM AND METHOD FOR IMPROVING CLARITY OF AUDIO SYSTEMS

(75) Inventor: Eliot M. Case, Denver, CO (US)

(73) Assignee: Qwest Communications International Inc., Denver, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/956,677

(22) Filed: Oct. 23, 1997

Related U.S. Application Data

(63) Continuation-in-part of application No. 08/587,126, filed on Jan. 11, 1996, now Pat. No. 6,023,513.

(51) Int. Cl.[7] ................................................ H03G 3/00
(52) U.S. Cl. .......................................... 381/61; 381/98
(58) Field of Search ........................... 381/61, 98, 103; 84/698

(56) References Cited

U.S. PATENT DOCUMENTS

| | | | |
|---|---|---|---|
| 3,828,133 A | 8/1974 | Ishigami et al. | 179/1 SA |
| 4,150,253 A | 4/1979 | Knoppel | 179/1 R |
| 5,133,014 A | 7/1992 | Pritchard | 381/61 |
| 5,359,665 A | 10/1994 | Werrbach | 381/102 |
| 5,422,602 A | 6/1995 | Werrbach | 330/281 |
| 5,424,488 A | 6/1995 | Werrbach | 84/698 |
| 5,705,950 A * | 1/1998 | Butler | 330/3 |
| 5,748,747 A * | 5/1998 | Massie | 381/61 |
| 5,848,165 A * | 12/1998 | Pritchard | 381/61 |
| 6,023,513 A * | 2/2000 | Case | 381/61 |
| 6,111,960 A * | 8/2000 | Aarts et al. | 381/61 |

* cited by examiner

Primary Examiner—Forester W. Isen
Assistant Examiner—Brian Pendleton
(74) Attorney, Agent, or Firm—Brooks & Kushman P.C.

(57) ABSTRACT

A system and method for improving clarity of an audio signal selects frequencies of the audio signal for processing and adds even harmonic distortion to the selected frequencies, preferably, of at least the second order. The system and method are particularly suited for hearing aid, voice messaging, and telephony applications. In addition, the system and method may be applied to other very low bandwidth signals, such as data compressed audio signals, computer voice files, computer audio files, and numerous other technologies which have an audio response less than normal human perception. The technique also applies to the use of perceptually coded audio.

16 Claims, 9 Drawing Sheets

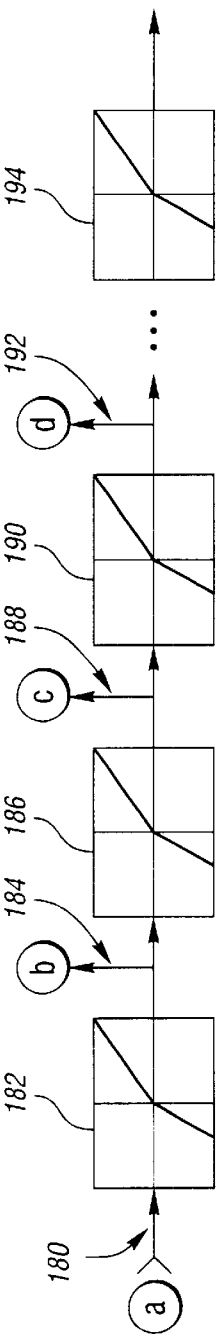
Fig. 14
Fig. 15a
Fig. 15c
Fig. 15b
Fig. 15d

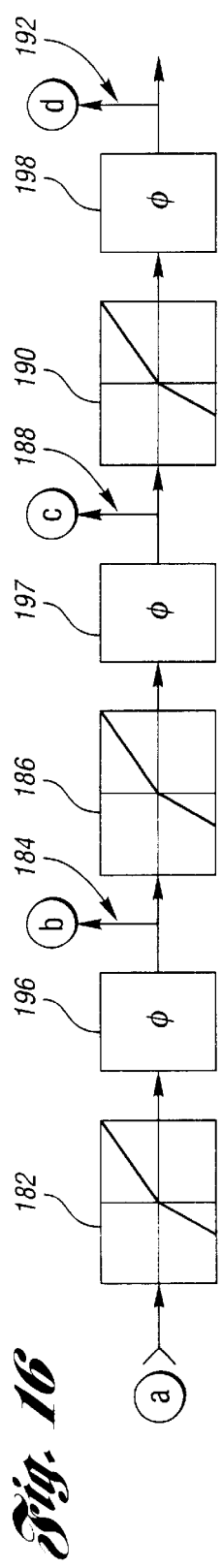
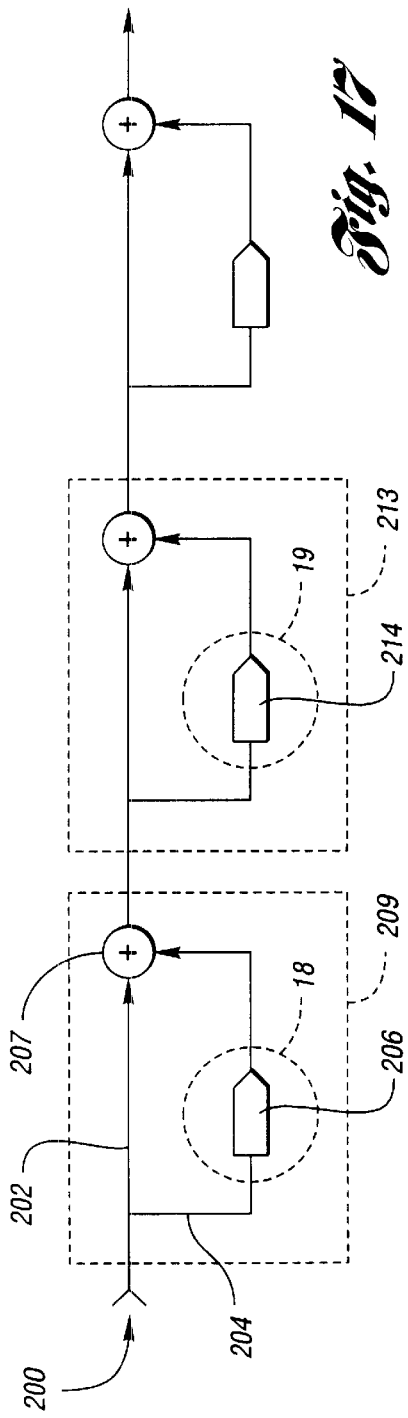
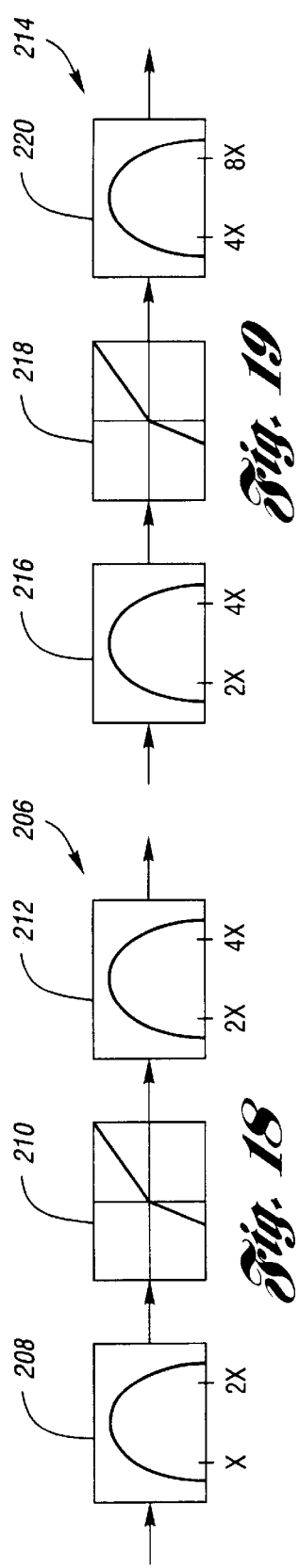
Fig. 16
Fig. 17
Fig. 18
Fig. 19

SYSTEM AND METHOD FOR IMPROVING CLARITY OF AUDIO SYSTEMS

CROSS-REFERENCE TO RELATED APPLICATIONS

This application is a continuation-in-part of U.S. application Ser. No. 08/587,126, filed Jan. 11, 1996, now U.S. Pat. No. 6,023,513.

TECHNICAL FIELD

The present invention relates to a system and method for improving the quality, clarity, and intelligibility of devices such as hearing aids, voice messaging systems, and telephone switches by adding even harmonic distortion to audio signals.

BACKGROUND ART

The process of adding harmonic distortion, particularly even harmonic distortion, to improve the clarity of audio signals is known in the field of audio signal processing. U.S. Pats. Nos. 3,828,133, 4,150,253, 5,133,014, and 5,359,655 disclose processes in which the audio signal is divided into two signal paths. One signal path is utilized to generate the harmonic distortion which is then combined with the other signal path to produce and enhance the audio signal. The combined signal is perceived to be of higher quality when even harmonic distortion is used. This is particularly true when the audio signal is a voice signal.

Processes for producing even harmonic distortion have been employed in wide bandwidth (20 Hz to 20 KHz) signal processing, i.e., high fidelity audio signals. For example, U.S. Pat. No. 5,424,488 discloses a harmonics generator which may be used to improve the sound quality of electronic audio equipment.

In the past, hearing aids have used equalization to compensate for hearing losses. However, it is desirable to provide a system and method for harmonic enhancement of hearing aids because the enhancement provides a richer, more detailed sound to the user.

It is also desirable to provide a system and method for harmonic enhancement of mechanisms that limit the human perception of audibility such as telephone systems, cellular phone systems, low bit rate audio, perceptually encoded low bit-rate audio, and low band-width audio. For instance, it is desirable to provide harmonic enhancement to overcome hashing noises commonly found in voice messaging systems and telephone switches employing data compression methods.

SUMMARY OF THE INVENTION

Accordingly, it is an object of the present invention to provide an even order harmonic enhancement system and method for improving audio clarity of hearing aids and other communication devices such as voice messaging systems and telephone switches.

It is another object of the present invention to provide a first order (or higher) even harmonic generator enhancement system and method for improving audio clarity of hearing and other communication systems.

In carrying out the above objects and other objects, the present invention provides a method of improving clarity of an input signal for a hearing aid. The method includes selecting frequencies of the input signal for processing and adding even harmonic distortion, preferably, of at least the second order, to the selected frequencies.

A system for implementing the method according to the present invention is also disclosed. Other methods and systems are also disclosed in accordance with the present invention.

These and other features, aspects, and embodiments of the present invention will become better understood with regard to the following description, appended claims, and accompanying drawings.

BRIEF DESCRIPTION OF THE DRAWINGS

FIG. 14 is a signal flow back diagram illustrating a method for higher order generation according to the present invention;

FIG. 15a illustrates an input signal;

FIG. 15b illustrates an output signal from a first order harmonic generator;

FIG. 15c illustrates an output signal from a second order harmonic generator;

FIG. 15d illustrates an output signal from a third order harmonic generator;

FIG. 16 is an alternative embodiment of the signal flow back diagram of FIG. 14;

FIG. 17 illustrates a block diagram of an alternative implementation of the present invention;

FIG. 18 illustrates a block diagram of a circuit shown in FIG. 17;

FIG. 19 illustrates a block diagram of a circuit shown in FIG. 17;

BEST MODES FOR CARRYING OUT THE INVENTION

Figure 1:
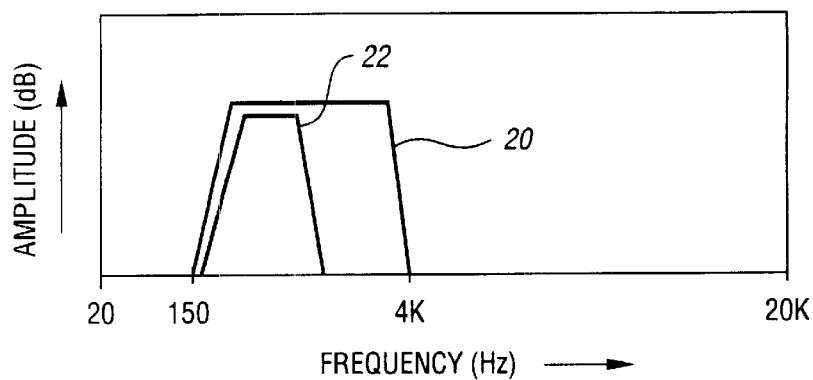
FIG. 1 is a diagram illustrating a typical bandwidth.

Referring now to FIG. 1, a diagram is shown illustrating a representative bandwidth. Bandwidth 20 extends from 150 Hz to about 4 KHz. A portion of the frequencies within bandwidth 20, as represented by bandwidth 22 are selected for processing according to the present invention. This selection may be performed electronically by a band pass filter, or may be implemented by a programmed microprocessor in digital applications, as is well known in the art. Bandwidth 22 preferably excludes low frequencies and has a range of about 150 Hz to about 1.5 KHz. Bandwidth 22 may have a lower cut-off frequency which is equal to the lower cut-off frequency of the limited bandwidth channel 20, if desired.

Figure 2:
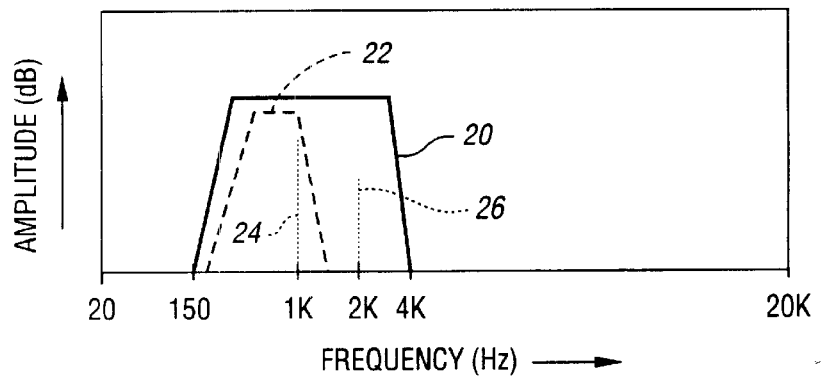
FIG. 2 is a diagram illustrating addition of even harmonic distortion within the typical bandwidth of FIG. 1.

Referring now to FIG. 2, addition of even harmonic distortion within bandwidth 22 is shown. An audio input signal having frequency components within bandwidth 22, such as component 24, is acted upon by a circuit or system according to the present invention to produce even harmonic distortion, such as frequency component 26. Appropriate selection of frequencies within bandwidth 22 maintains the harmonic distortion within bandwidth 20.

Figure 3:
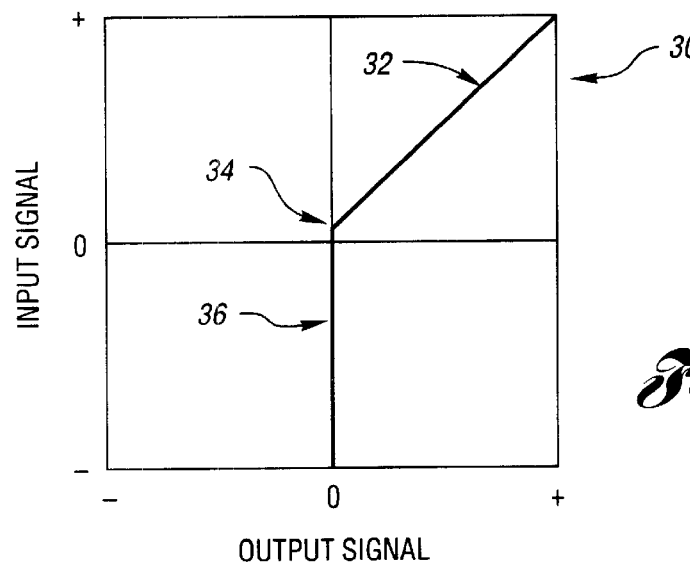
FIG. 3 is a diagram illustrating a non-linear transfer function for generating even harmonic distortion according to the present invention.

Referring now to FIG. 3, a diagram illustrating a non-linear transfer function for generation of even harmonic distortion according to the present invention is shown. The transfer function, indicated generally by reference numeral 30, may be implemented by an electronic circuit, a programmed microprocessor, or a combination of the two, as known in the art. An electronic circuit implementation of a similar transfer function is illustrated and described with reference to FIG. 8. Transfer function 30 of FIG. 3 includes a linear portion 32, an offset portion 34, and a clipping portion 36. An output signal may be determined by projecting points on an input signal along the horizontal axis until they intercept the transfer function at which point they are projected vertically and plotted on a corresponding time scale for the output signal.

Figure 4A:
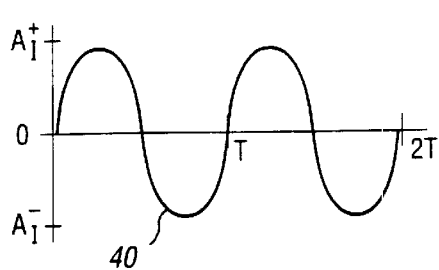
FIG. 4a illustrates a representative audio input signal.
Figure 4B:
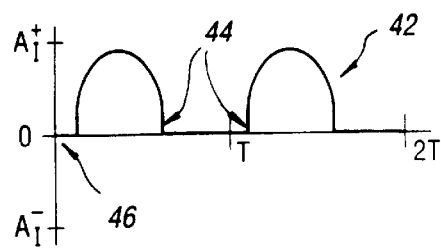
FIG. 4b illustrates an audio output signal produced by the input signal of FIG. 4a after passing through a system having a transfer function such as that illustrated in FIG. 3.

FIGS. 4a and 4b illustrate a representative input and corresponding output signal, respectively, after applying the transfer function of FIG. 3 to the input signal of FIG. 4a. As illustrated, a representative input signal 40 is a sine wave having a period T and amplitude $A_I$. After applying the transfer function of FIG. 1, an output with even harmonics is produced as illustrated in FIG. 4b. The output wave form 42 also has a period of T and an amplitude of $A_O$. The amplitude of the output, $A_O$, may be less than, equal to, or greater than the corresponding amplitude $A_I$ of the input depending on the slope of linear portion 32 of transfer function 30. Output waveform 42 includes linear portions 44 and 46 due to offset portion 34 of transfer function 30.

Figure 5:
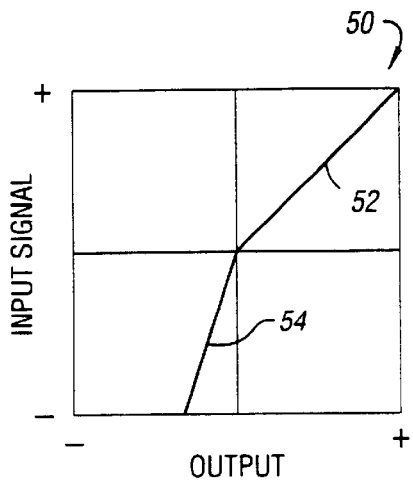
FIG. 5 illustrates an alternative embodiment for a system having a transfer function for generating even harmonic distortion according to the present invention.
Figure 6A:
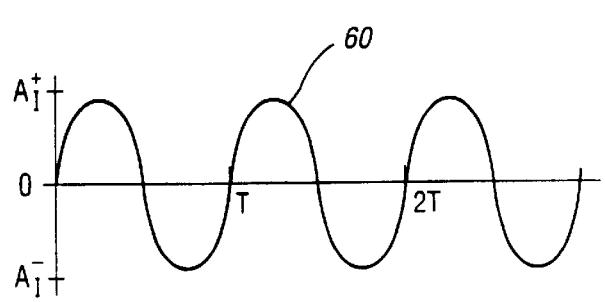
FIG. 6a illustrates a representative audio input signal.
Figure 6B:
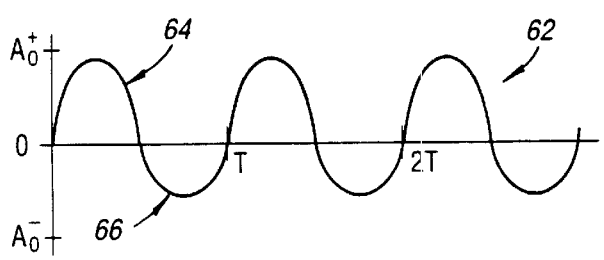
FIG. 6b illustrates an audio output signal produced by the input signal of FIG. 6a after passing through a system having a transfer function such as that illustrated in FIG. 5.

Referring now to FIG. 5, an alternative transfer function for use with the system and method according to the present invention is shown. Transfer function 50 includes a first linear portion 52 having a first slope $m_1$ and a second linear portion 54 having a second slope $m_2$. Preferably, the value of $m_1$ is about unity while the value of $m_2$ is less than unity. Thus, transfer function 50 applied to a representative input signal, such as the sinusoidal input signal 60 of FIG. 6a, results in a distorted sinusoidal signal 62 illustrated in FIG. 6b. As shown in FIG. 6a, input signal 60 has symmetric positive half-cycles with an amplitude of $A_{I+}$ and negative half-cycles with an amplitude of $A_{I-}$ where $A_{I+}$ is equal to $A_{I-}$. Output signal 62 illustrated in FIG. 6b, however, is asymmetric about the amplitude axis because the ratio of slopes $m_1/m_2$ is not equal to unity. Thus, the transfer function 50 emphasizes the even harmonics of the input signal by applying a greater gain to positive half cycles 64 than the gain applied to negative half cycles 66.

Figure 7:
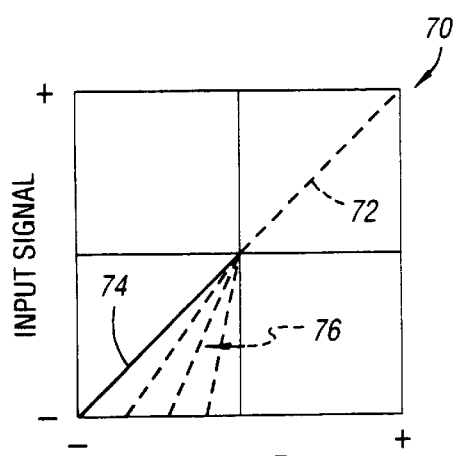
FIG. 7 illustrates an alternative embodiment for a system having a transfer function for generating even harmonic distortion according to the present invention.

Referring now to FIG. 7, another embodiment of a transfer function for imparting even harmonic distortion to an audio signal according to the present invention is shown. Transfer function 70 includes a linear portion 72 which acts on the positive half cycles of the input signal and a linear portion 74 which provides variable distortion amounts as indicated by lines of differing slopes 76. Portion 74 of transfer function 70 operates on the negative half-cycles and may be selectively controlled by a particular user. For example, in a communications network, a user may adjust the amount of distortion added to the signal so as to adapt the signal.

Figure 8:
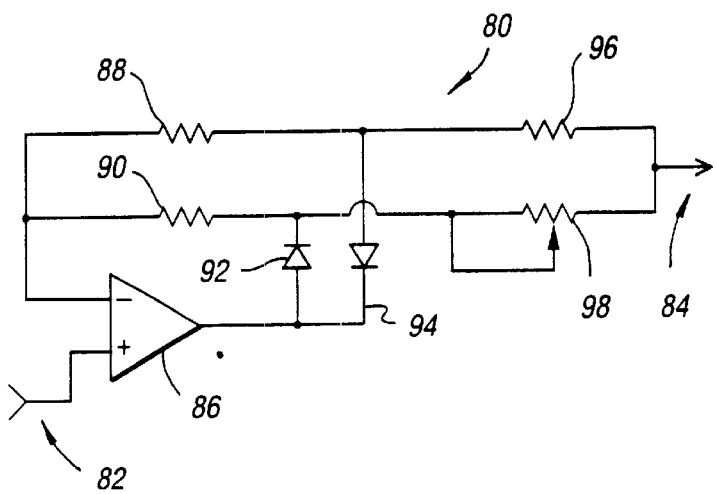
FIG. 8 is a circuit schematic illustrating a possible implementation of a non-linear transfer function for producing second harmonic distortion according to the present invention.

Referring now to FIG. 8, a representative electronic circuit is shown which adds even harmonic distortion to an input signal according to the present invention. Electronic circuit 80 acts upon an input applied at terminals 82 to produce an enhanced output signal at terminal 84. Circuit 80 includes an amplifier 86, having negative feedback supplied through resistors 88, 90, 96, and 98 and diodes 92 and 94. Diodes 92 and 94 provide a non-linearity in the transfer function such that the gain for the positive and negative half-cycles may be selectively controlled to produce results such as those illustrated in FIG. 6b. Preferably, resistor 98 is a variable resistor, such as a potentiometer, to provide for variable negative half cycle gains which produce variable even harmonic distortion.

Figure 9:
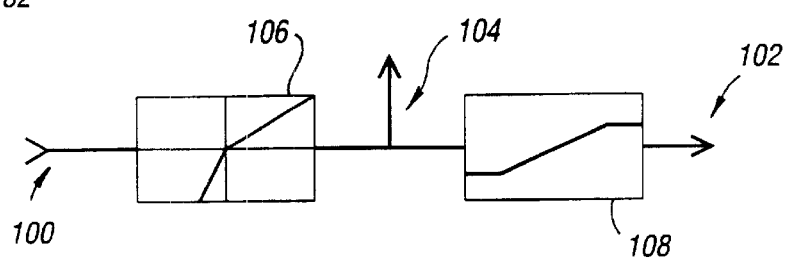
FIG. 9 is a signal flow block diagram illustrating a method for second harmonic generation according to the present invention.

Referring now to FIG. 9, a block diagram illustrating an alternative implementation of the present invention is shown. An input signal is applied to terminal 100 and an output signal may be produced at terminal 102 or 104 depending upon the particular application. Block 106 represents a component having a non-linear transfer function which may be implemented via an electronic circuit or a programmed microprocessor as described herein. The output signal at terminal 104 may be used in systems which do not require further enhancement to the signal clarity. Block 108 represents a component having a gain which varies as a function of frequency. Thus, the function of block 108 is to boost high frequency components of the audio signal. Because this occurs after adding the even harmonic distortion, block 108 amplifies both the natural and artificial harmonics.

Figure 10:
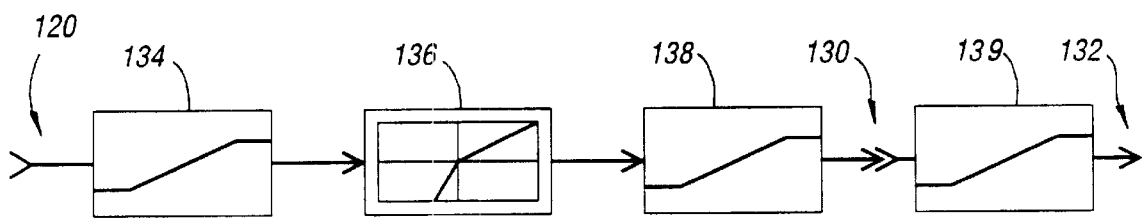
FIG. 10 is a signal flow block diagram illustrating an alternative embodiment for even harmonic distortion generation using a single signal path according to the present invention.

Another alternative implementation of a system for generating even harmonic distortion according to the present invention is illustrated in FIG. 10. An input signal is applied at terminal 120 and an output signal is obtained at terminal 130 or, if optional block 139 is used, at terminal 132. Block 134 represents selection of a portion of the frequencies in the input signal by applying a higher gain to those selected frequencies than the gain applied to the deselected frequencies. Block 136 introduces the non-linear, even harmonic distortion. Block 138 amplifies the higher frequency components of the enhanced signal which may be further enhanced at block 139 to fill-out or level the upper end of the bandwidth as explained in detail below. of course, either of blocks 138 or 139 could represent low pass or band pass filters instead of high pass filters as shown in FIG. 10.

Figure 11:
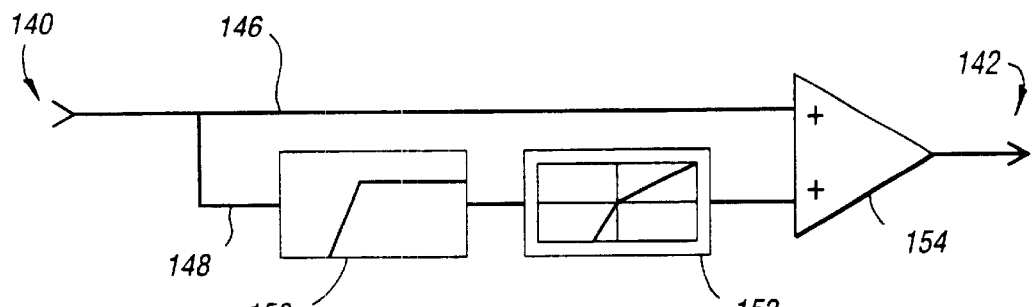
FIG. 11 is a signal flow block diagram illustrating an alternative method for generating even harmonic distortion using dual signal paths.

Yet another embodiment for adding even harmonic distortion to an audio signal is illustrated in FIG. 11. An audio input signal is applied to terminal 140 and the enhanced audio output signal is generated at terminal 142. In this embodiment, a two-path approach is used. The input signal applied to terminal 140 is split, preferably equally, into a first path 146 and a second path 148. Second path 148 includes a high-pass filter 150 which selects a portion of the frequencies for processing. Block 152 generates the even harmonic distortion for those frequencies selected by block 150. The original signal is then combined with the distorted signal by amplifier 154.

While the examples illustrated herein have nonlinearities for negative polarities, the roles of the positive and negative polarities-may be reversed with the same effect without departing from the spirit or scope of the present invention.

Figure 12:
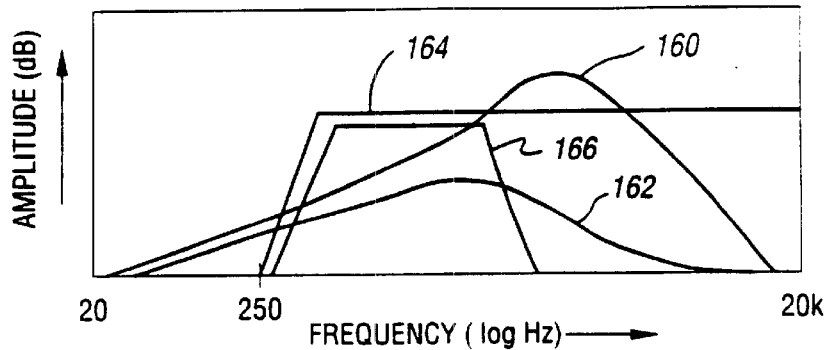
FIG. 12 is a diagram illustrating an approximate frequency response of the human ear and selection of frequencies for processing according to the present invention for use in a hearing aid.

Referring now to FIG. 12, a diagram illustrating an approximate frequency response of the human ear is shown. Of course, each individual will have a different frequency response curve which may change throughout his lifetime. Curve 160 represents the frequency response on a log scale for a person with normal hearing. Curve 162 represents the frequency response of a person with hearing loss which particularly attenuates higher frequency components. According to the present invention, input frequencies above some frequencies are selected for processing as indicated by bandwidths 164 or 166. Preferably, frequencies within bandwidth 166 are utilized such that the even harmonic distortion which is added to the signal to improve clarity falls within the bandwidth of the hearing impaired individual as represented by curve 162. Thus, bandwidth 166 may range from, for example, 250 Hz to about 2 KHz. Of course, the actual range may vary greatly depending upon the particular needs of the individual.

Figure 13:
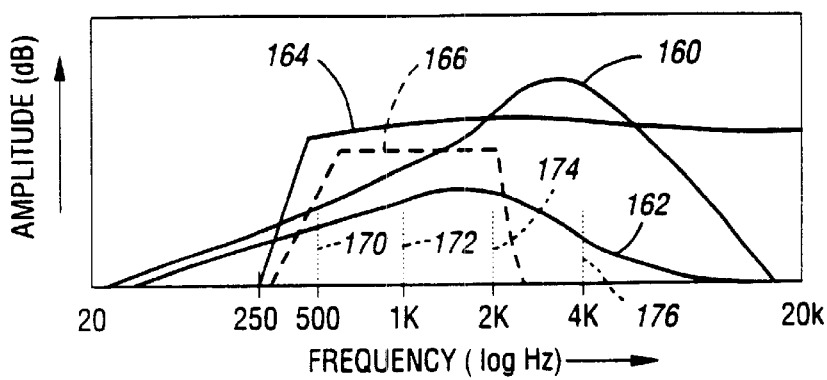
FIG. 13 illustrates even harmonic distortion generation according to the present invention for use with a hearing aid.

As illustrated in FIG. 13, even harmonics 172, 174, and 176 are added to a 500 Hz input signal 170 such that all of the even harmonic distortion is added inside the lower bandwidth of the hearing impaired individual, making the sound appear higher in fidelity at the ear. This process improves sound quality and clarity especially for voice sounds and requires less amplification to help compensate for high frequency hearing loss. The present invention is particularly effective because, although speech energy is generated from about 50 Hz to about 10 KHz, the energy is greatest in the 400 Hz to 600 Hz range which includes both the fundamental components of the speech wave and the first formants. Thus, the present invention may also be utilized to enhance the quality, clarity, and intelligibility of speech signals for hearing aids.

Referring now to FIGS. 14 and 15(a–d), a block diagram illustrating an alternative implementation of the present invention is shown. An input signal is applied to terminal 180. The input signal has a frequency of "X" and is illustrated in FIG. 15a. Block 182 introduces the non-linear, even harmonic distortion. An output signal is produced at terminal 184. The output signal from terminal 184 is illustrated in FIG. 15b and has the 2, 3, 4, 5, 6, 7, and 8 harmonic components. The output signal from terminal 184 is a first order harmonic enhancement of the input signal applied to terminal 180. Block 182 by itself is a first order harmonic generator. A problem with the first order harmonic enhancement is that the odd harmonics (i.e., 3, 5, 6, 7) are discordant and perceived as distorted if audible to the user.

The use of two or more harmonic generators in series with each other form a second (or higher) order harmonic generator. A higher order harmonic generator minimizes the discordant harmonics of a first order harmonic generator while enhancing the harmonics in the octaves of hearing. For instance, applying output signal at terminal 184 to block 186 produces output signal at terminal 186. The output signal at terminal 186 is illustrated in FIG. 15c. FIG. 15c shows the output for a second order harmonic generator. Notice how the discordant harmonics are minimized while the other harmonics are enhanced. Applying the output signal at terminal 188 to block 190 produces an output signal at terminal 192 which is further enhanced as illustrated in FIG. 15d. FIG. 15d shows the output for a third order harmonic generator. More harmonic generators may be added in series to form a higher order harmonic generator as shown by block 194.

Preferably, phase shift all pass circuits 196, 197, and 198 are used between blocks 182, 186, and 190, respectively, as shown in FIG. 16, to eliminate the effect of distorting the same portion of the passing wave in each stage. The phase shift circuits change the wave shape before each subsequent distortion stage. Furthermore, blocks 182, 186, 190, and 194 are illustrated in FIG. 14 as non-linear distortion devices. However, either of blocks 182, 186, 190 or 194 could be implemented by any of the block diagrams shown in FIGS. 9, 10, and 11.

Adding even harmonics of the input signal to the input signal may be used in a hearing aid to help compensate for normal ear distortions. Preferably, even harmonics of at least the second order of the input signal are added to the input signal.

The use of a second (or higher) harmonic generator enables the use of harmonic generation at much lower frequencies inside of the audible bandwidth of the user before the synthetic harmonics sound like distortion. This is an important distinction when compared to the prior art where harmonics can only be added in the top two octaves before being perceived as distortion. With the present invention, the harmonics can be added to the top three octaves in a second order system and the top four octaves in a third order system. Accordingly, if a user has only four octaves of hearing remaining by means of physiological conditions, the ability to enhance the entire range of hearing (without boosting high frequency gain as much as done typically with typical hearing aids) could reinstate a more complete intelligibility to the user.

Referring now to FIGS. 17 and 18, a block diagram illustrating an alternative implementation of the present invention is shown. In short, the block diagram shown in FIG. 17 filters the higher harmonics (i.e., those greater than 2) before adding the extra harmonics back to the original signal path. This results in a much less discordant enhancement.

Specifically, an input signal of frequency "X" is applied to terminal 200. The input signal applied to terminal 200 is split, preferably equally, into a first path 202 and a second path 204. The second path includes a non-linear transfer function gain filter circuit 206. Circuit 206 processes the input signal on second path 204 and then combines the processed signal with the signal on first path 202 at summer 207. As shown in FIG. 18, circuit 206 includes a first bandpass filter 208, a non-linear even harmonic distortion block 210, and a second bandpass filter 212. The signal from summer 207 is a first order harmonic enhancement of the input signal applied to terminal 200.

Block 209 by itself is a first order harmonic generator. The implementation shown in FIG. 17 differs from that shown in FIG. 14 in that circuit 206 filters the higher harmonics of the distortion before adding the extra harmonics back to the original signal path. A problem with the first order harmonic enhancement, as stated above, is that the odd harmonics (i.e., 3, 5, 6, 7) are discordant and perceived as distorted if audible to the user.

Thus, the signal from summer 207 can be applied to block 211 for second order enhancement. Block 211 is similar to block 209 and contains two signal paths and a non-linear transfer function gain circuit 214. As shown in FIG. 19, circuit 214 includes a first bandpass filter 216, a non-linear even harmonic distortion block 218, and a second bandpass filter 220. Notice that filters 216 and 220 filter frequencies twice as high as the frequencies filtered by filters 208 and 212.

Blocks 209 and 213 form a second order harmonic generator. More blocks can be added to form a higher order harmonic generator. In subsequent blocks, the filters progressively filter higher frequencies.

Figure 20:
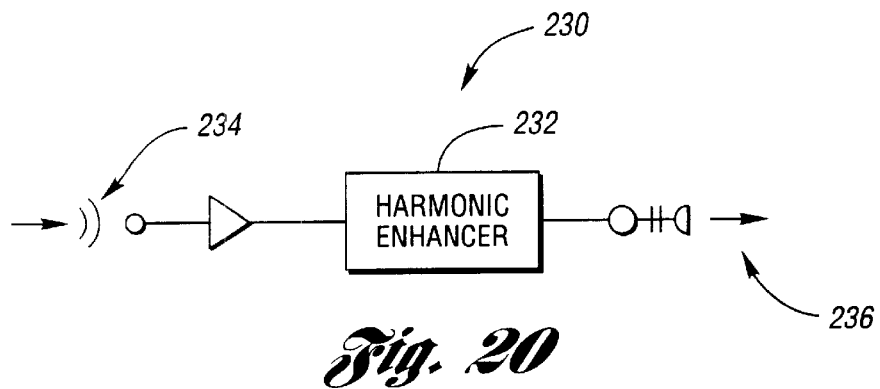
FIG. 20 illustrates a schematic of a hearing aid employing the present invention.

Referring now to FIG. 20, a schematic of a hearing aid 230 is shown. Hearing aid 230 includes a harmonic enhancer 232. Harmonic enhancer 232 is a second order (or higher) harmonic generator of the type described with reference to FIGS. 14, 16, and 17. Harmonic generator 232 processes sound input 234 to produce sound output 236 for a user.

Figure 21:
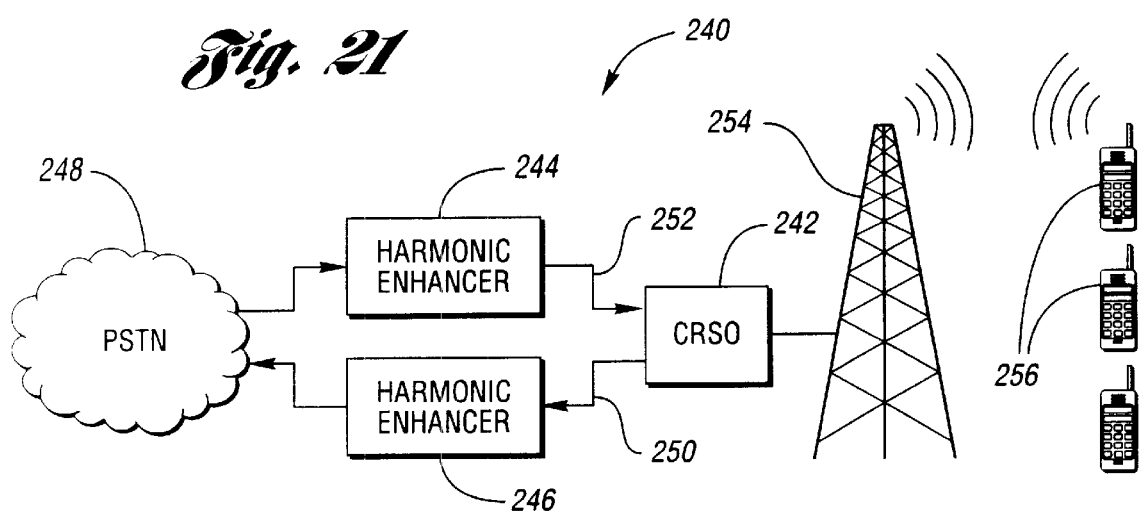
FIG. 21 illustrates a schematic of a cellular phone system employing the present invention.

Referring now to FIG. 21, other types of communication systems such as a cellular telephony system 240 may include harmonic enhancers 244 and 246 in accord with the present invention. Harmonic enhancers 244 and 246 are placed between a Public Switched Telephone Network (PSTN) 248 and a Cellular Radio Switching Office (CRSO) 242. CRSO 242 switches calls between mobile phones and wirelines. Harmonic enhancer 244 is employed on transmit line 250 and harmonic enhancer 246 is employed on receive line 252. Either one or both of harmonic enhancers 244 and 246 may be used at any one time. CRSO 242 is connected to antenna 254 for transmitting and receiving phone signals from mobile phone units 256.

Typically, data compression techniques such as ADPCM, CELP, LPC, etc. are used in a switch such as CRSO 242 to enable the radio bandwidth to handle more calls. A problem with data compression is that at times it causes a hashing sound which is perceptible to the phone user. Harmonic enhancers 244 and 246 enhance voice signals on the lines to overcome the hashing noises.

Figure 22:
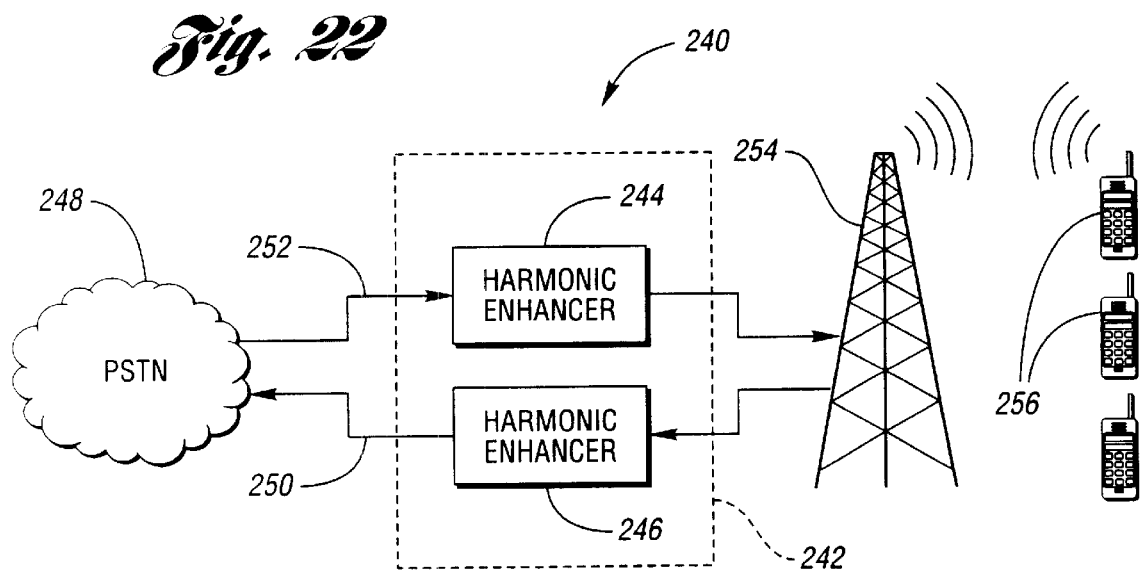
FIG. 22 illustrates a schematic of an alternative cellular phone system employing the present invention.

Referring now to FIG. 22, harmonic enhancers 244 and 246 may be incorporated as part of CRSO 242. Of course, harmonic enhancers 244 and 246 may be incorporated into other phone switches such as central office telephone switches.

Figure 23:
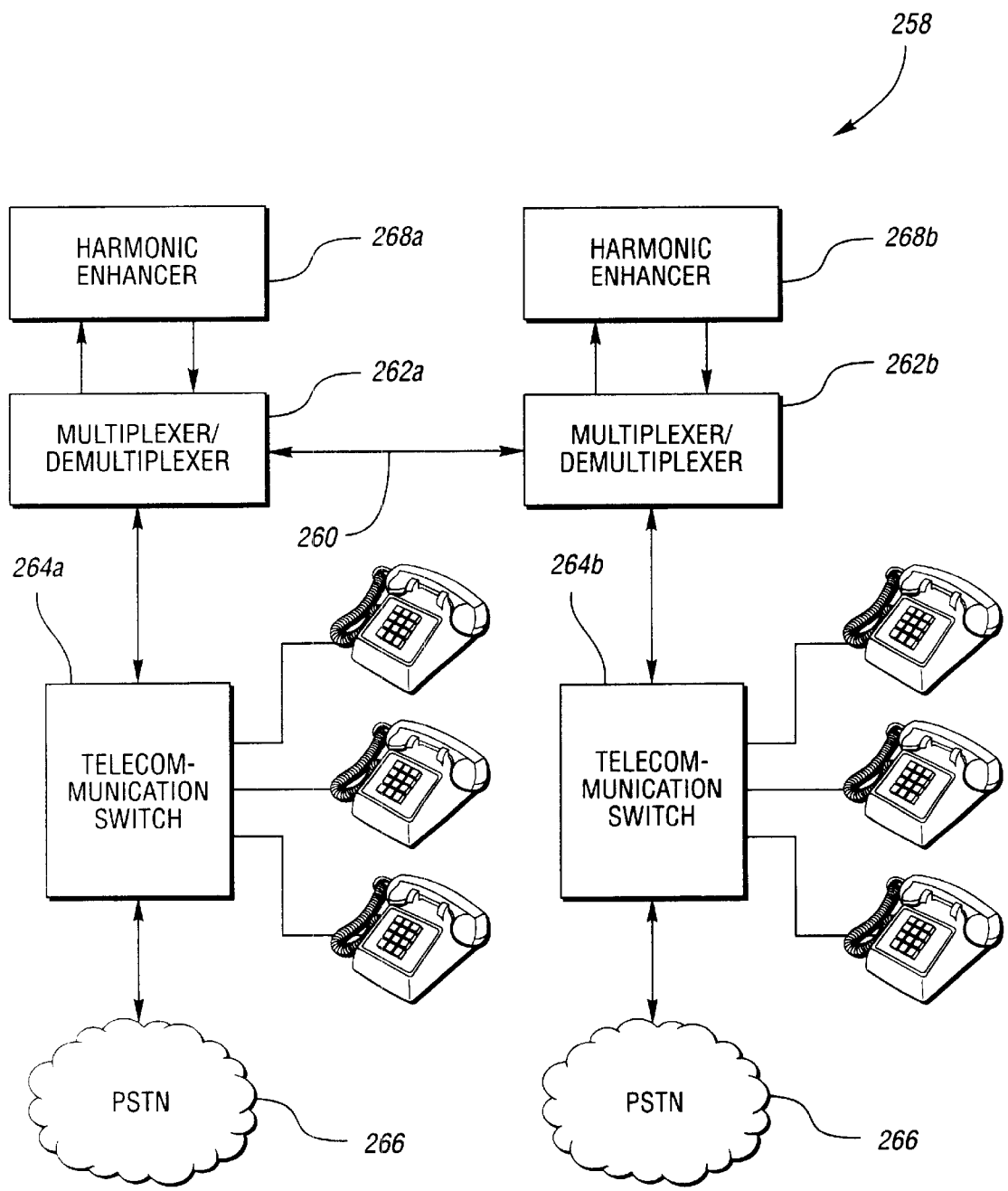
FIG. 23 illustrates a schematic of a system employing a T1 transport line in accordance with the present invention.

Referring now to FIG. 23, still other types of systems such as communication system 258 may utilize harmonic enhancement in accordance with the present invention. Communication system 258 includes a public or private T1 transport line 260 connected between a pair of multiplexer/demultiplexers (MUX/DEMUX) 262 (a–b). Typically, T1 transport line 260 has a bandwidth large enough to accommodate 24 phone lines. MUX/DEMUX 262(a–b) perform data compression on voice signals from telecommunication switches 264(a–b) and PSTN 266 to compress, for example, 96 phone lines into 24 phone lines for transmission on T1 transport line 260. Harmonic enhancers 268(a–b) enhance the voice signals before data compression by MUX/DEMUX 262 (a–b) to prevent generation of the hashing noise associated therewith.

In operation, MUX/DEMUX 262a receives 96 voice signals from telecommunication switch 264a and PSTN 266 for transmission to MUX/DEMUX 262b on T1 transport line 260. Before compression by MUX/DEMUX 262a, harmonic enhancer 268a enhances the voice signals by adding even harmonics of each of the voice signals to each of the respective voice signals. MUX/DEMUX 262a then data compresses the 96 enhanced voice signals for accommodation on T1 transport lie 260. The compressed voice signals are then transmitted along the T1 transport line 260 and are received by MUX/DEMUX 262b which decompresses the voice signals. MUX/DEMUX 262b then provides the decompressed voice signals to telecommunication switch 264b for appropriate routing to telephones associated with the switch or PSTN 266.

Figure 24:
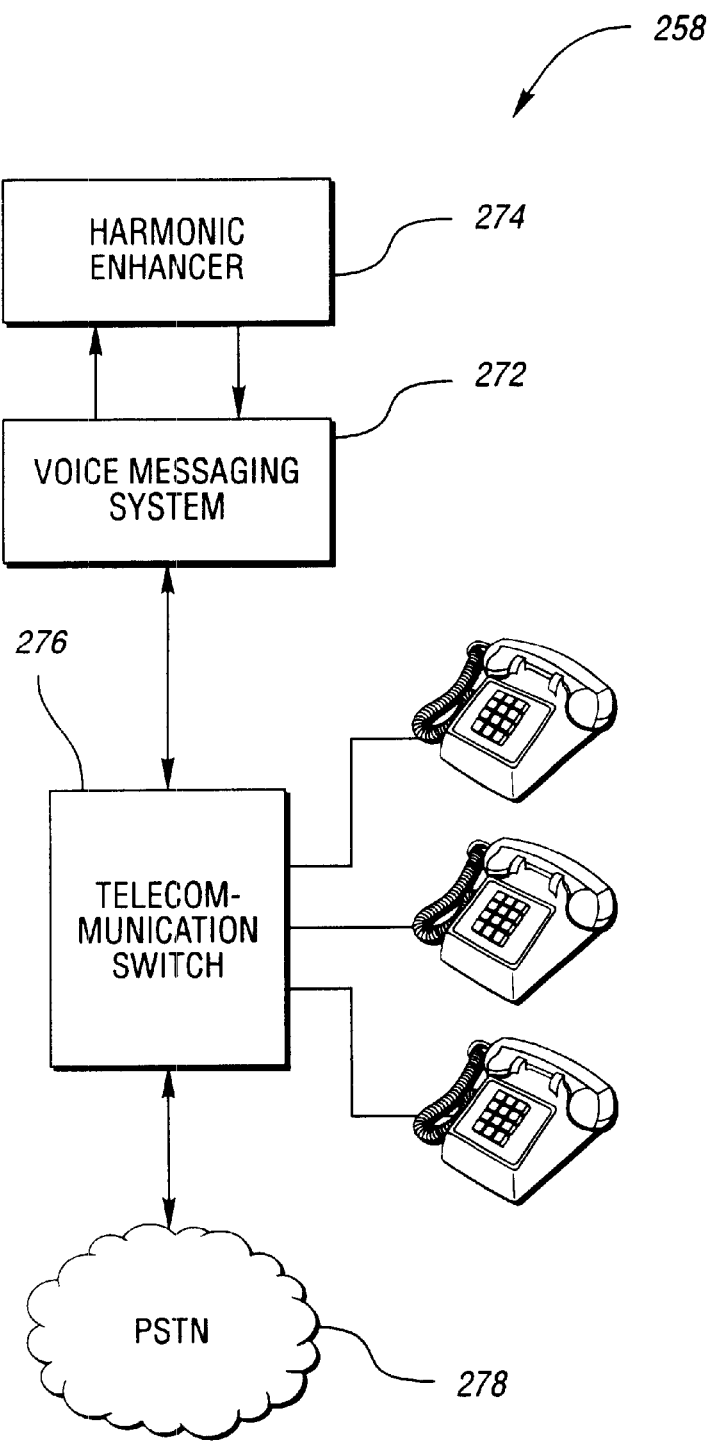
FIG. 24 illustrates a schematic of a voice messaging system employing the present invention.

Referring now to FIG. 24, still yet other types of systems such as a communication system 270 may utilize harmonic enhancement in accordance with the present invention. Communication system 270 includes a voice messaging system 272 and a harmonic enhancer 274.

Harmonic enhancer 274 enhances voice signals by adding even harmonics to each-of the voice signals before storage by voice messaging system 272. Voice messaging system 272 then provides the voice signals to telecommunication switch 276 for appropriate routing to telephones associated with the switch or PSTN 278.

As described herein, the present invention works well with audio signals, such as those used in telephony and hearing aid applications. However, one of ordinary skill in the art will recognize that the present invention works equally well with very low bandwidth signals, such as data compressed audio signals, computer voice files, computer audio files, and numerous other technologies which have an audio response less than normal human perception. The technique also applies to the use of perceptually coded audio.

It should be noted that the present invention may be used in a wide variety of different constructions encompassing many alternatives, modifications, and variations which are apparent to those with ordinary skill in the art. Accordingly, the present invention is intended to embrace all such alternatives, modifications, and variations as fall within the spirit and scope of the appended claims.

What is claimed is:

1. A method for improving clarity of an input signal for a hearing aid, the method comprising:
   selecting frequencies of the input signal for processing; and
   adding even harmonic distortion to the selected frequencies by applying a nonlinear transfer function having a ratio of positive half-cycle gain to a negative half-cycle gain greater than unity.

2. The method of claim 1 wherein:
   the even harmonic distortion added to the selected frequencies is of at least the second order.

3. The method of claim 1 wherein adding comprises:
   applying a nonlinear transfer function having a unity gain for positive half-cycles and a gain less than unity for negative half-cycles.

4. The method of claim 3 wherein:

the nonlinear transfer function has a variable negative half cycle gain.

5. The method of claim 1 wherein selecting comprises:

attenuating a portion of the frequencies of the input signal by applying a gain less than unity so as to deselect that portion.

6. The method of claim 1 wherein selecting comprises:

amplifying a portion of the frequencies of the input signal by applying a gain greater than unity so as to select that portion.

7. A method for improving clarity of an audio signal for a phone switch, the method comprising:

selecting frequencies of the audio signal for processing; and adding even harmonic distortion to the selected frequencies by applying a nonlinear transfer function having a ratio of positive half-cycle gain to negative half-cycle gain greater than unity.

8. The method of claim 7 wherein:

the even harmonic distortion added to the selected frequencies is of at least the second order.

9. The method of claim 7 wherein:

the phone switch is a central office telephone switch.

10. The method of claim 7 wherein:

the phone switch is a cellular phone switch.

11. The method of claim 7 wherein adding comprises:

applying a nonlinear transfer function having a unity gain for positive half-cycles and a gain less than unity for negative half-cycles.

12. The method of claim 11 wherein:

the nonlinear transfer function has a variable negative half cycle gain.

13. A method of improving clarity of an audio signal for a voice messaging system, the method comprising:

selecting frequencies of the audio signal for processing; and adding even harmonic distortion to the selected frequencies by applying a nonlinear transfer function having a ratio of positive half-cycle gain to negative half-cycle gain greater than unity.

14. The method of claim 13 wherein:

the even harmonic distortion added to the selected frequencies is of at least the second order.

15. The method of claim 13 wherein adding comprises:

applying a nonlinear transfer function having a unity gain for positive half-cycles and a gain less than unity for negative half-cycles.

16. The method of claim 15 wherein:

the nonlinear transfer function has a variable negative half cycle gain.

* * * * *